US012579339B2

(12) United States Patent
Hara et al.

(10) Patent No.: US 12,579,339 B2
(45) Date of Patent: Mar. 17, 2026

(54) AIRCRAFT MANEUVERING SYSTEM FOR SINGLE PROPELLER AIRCRAFT AND SINGLE PROPELLER AIRCRAFT

(71) Applicant: SUBARU CORPORATION, Tokyo (JP)

(72) Inventors: Shunichiro Hara, Tokyo (JP); Takeshi Fukurose, Tokyo (JP); Koji Ikeda, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 1009 days.

(21) Appl. No.: 17/694,269

(22) Filed: Mar. 14, 2022

(65) Prior Publication Data

US 2022/0309211 A1      Sep. 29, 2022

(30) Foreign Application Priority Data

Mar. 29, 2021      (JP) ................................. 2021-055319

(51) Int. Cl.
    *G06F 7/48*        (2006.01)
    *B64C 9/32*        (2006.01)
        (Continued)

(52) U.S. Cl.
    CPC .............. *G06F 30/20* (2020.01); *B64C 9/323* (2013.01); *B64C 13/16* (2013.01); *B64D 31/04* (2013.01); *G09B 9/165* (2013.01); *G09B 9/44* (2013.01)

(58) Field of Classification Search
    CPC ......... B64C 13/16; B64C 9/323; B64D 31/04; G06F 30/15; G06F 30/20; G09B 9/165; G09B 9/44
    See application file for complete search history.

(56) References Cited

U.S. PATENT DOCUMENTS 5,634,613 A  *  6/1997  McCarthy ............. B64C 23/069
                                   244/46
5,645,250 A  *  7/1997  Gevers ................... B64D 35/04
                                   244/50

(Continued)

FOREIGN PATENT DOCUMENTS

JP    2000-225997 A    8/2000
JP    2000-318692 A    11/2000

OTHER PUBLICATIONS

Office Action issued on Jul. 16, 2024, in corresponding Japan Patent Application No. 2021-055319, 6 pages.

*Primary Examiner* — Nithya J. Moll
(74) *Attorney, Agent, or Firm* — Rimon P.C.

(57) ABSTRACT

A jet aircraft maneuvering characteristic simulation system for a single propeller aircraft includes a power lever, speed brakes, and a controller. The power lever is configured to change a thrust of the single propeller aircraft. The speed brakes are provided on respective right and left sides of the single propeller aircraft. The controller is configured to, in response to an operation of the power lever to raise the thrust of the single propeller aircraft, deploy both the right and the left speed brakes to cause an increase in speed of the single propeller aircraft to be moderate, and control the speed brakes to cause a force in a yaw direction and a force in a roll direction to be generated that act against a turning tendency of the single propeller aircraft by making amounts of the deployment of the right and the left speed brakes different from each other.

17 Claims, 4 Drawing Sheets

(51) Int. Cl.

| | |
|---|---|
| *B64C 13/16* | (2006.01) |
| *B64D 31/04* | (2006.01) |
| *G06F 30/20* | (2020.01) |
| *G09B 9/16* | (2006.01) |
| *G09B 9/44* | (2006.01) |

(56) References Cited

U.S. PATENT DOCUMENTS

| | | | | |
|---|---|---|---|---|
| 9,840,339 | B1 | 12/2017 | O'Brien et al. | |
| 2003/0052224 | A1 | 3/2003 | Bretscher et al. | |
| 2006/0032970 | A1* | 2/2006 | Allen | B64C 29/0033 |
| | | | | 244/7 B |
| 2010/0083669 | A1* | 4/2010 | Foster | B64D 31/06 |
| | | | | 60/802 |
| 2017/0341731 | A1* | 11/2017 | Dorsett | B64C 5/10 |

* cited by examiner

AIRCRAFT MANEUVERING SYSTEM FOR SINGLE PROPELLER AIRCRAFT AND SINGLE PROPELLER AIRCRAFT

CROSS-REFERENCE TO RELATED APPLICATIONS

The present application claims priority from Japanese Patent Application No. 2021-055319 filed on Mar. 29, 2021, the entire contents of which are hereby incorporated by reference.

BACKGROUND

The technology relates to a jet aircraft maneuvering characteristic simulation system for a single propeller aircraft and to a single propeller aircraft.

The following example training may be performed in a case of training a pilot of a jet aircraft at a stage where a maneuvering skill of a trainee is improved. For example, the trainee is made to board a jet aircraft disclosed in, for example, Japanese Unexamined Patent Application Publication No. 2000-318692, and a level of a flight mode is increased from a training aircraft mode to a fighter aircraft mode to train the trainee.

However, many of the trainees initially start the training using a single propeller aircraft which is relatively low in speed, and thereafter step up to a twin-engine aircraft or the jet aircraft.

SUMMARY

An aspect of the technology provides a jet aircraft maneuvering characteristic simulation system for a single propeller aircraft. The jet aircraft maneuvering characteristic simulation system includes a power lever, speed brakes, and a controller. The power lever is configured to change a thrust of the single propeller aircraft. The speed brakes are provided on respective right and left sides of the single propeller aircraft. The controller is configured to, in response to an operation of the power lever to raise the thrust of the single propeller aircraft, deploy both the right and the left speed brakes to cause an increase in speed of the single propeller aircraft to be moderate, and control the speed brakes to cause a force in a yaw direction and a force in a roll direction of the single propeller aircraft to be generated that act against a turning tendency of the single propeller aircraft by making an amount of the deployment of the right speed brake and an amount of the deployment of the left speed brake different from each other.

An aspect of the technology provides a ingle propeller aircraft, including the above-described jet aircraft maneuvering characteristic simulation system.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

A turning tendency is a maneuvering characteristic unique to a single propeller aircraft.

The turning tendency refers to a tendency in which an airframe tends to turn to the right or the left when a pilot or a trainee operates a power lever (also referred to as a "throttle lever") to raise the thrust. The turning tendency is considered due to a combined effect of factors including, for example, a propeller slipstream, a P-factor, a gyro effect, and a torque reaction.

In order to counter the turning tendency of the single propeller aircraft, it is necessary for the pilot or the trainee to step on a rudder that is opposite to the turning tendency. For example, it is necessary for the pilot or the trainee to step on a right rudder in a case where the turning tendency is a left-turning tendency.

A technique of stepping on the rudder in response to the power lever operation, however, is unnecessary for an operation of a jet aircraft, and becomes useless when the trainee maneuvers the jet aircraft in the future.

The single propeller aircraft also has a feature that a response of the thrust to the operation of the power lever is better than that of the jet aircraft.

Figure 5:
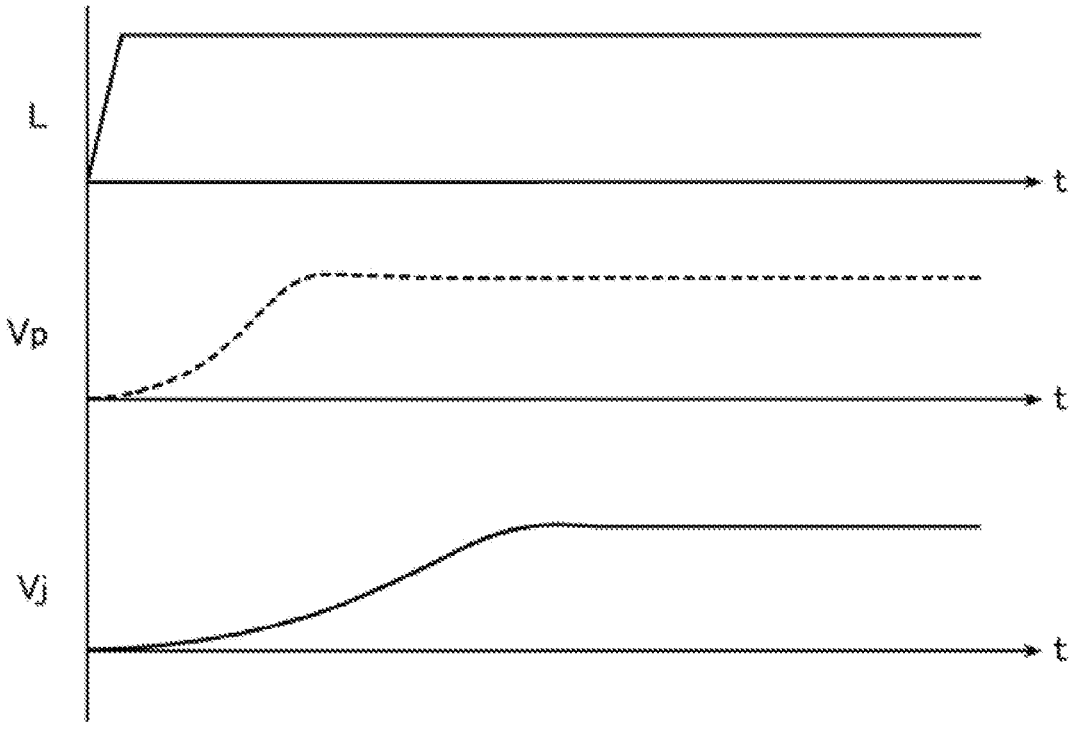
FIG. 5 is a diagram illustrating a relationship between the operation of the power lever, the change in the speed of the single propeller aircraft, and a change in speed of a jet aircraft.

For example, as illustrated in FIG. 5, when the pilot operates a power lever L to raise the thrust, a speed Vp of the single propeller aircraft increases relatively rapidly, whereas a speed Vj of the jet aircraft increases moderately. As a result, a speed of the single propeller aircraft increases faster than the speed of the jet aircraft.

Accordingly, if the trainee becomes accustomed to such a thrust characteristic (i.e., the rapid increase in speed) of the single propeller aircraft, the trainee can feel a sense of strangeness when a training of the trainee is transferred to the jet aircraft, which can result in a delay in progress of the maneuvering skill of the jet aircraft.

The above-mentioned concerns of the trainee becoming accustomed to the turning tendency and the rapid increase in speed of the single propeller aircraft, tend to appear significantly upon a training using an aircraft such as a military trainer equipped with large-power engines for its airframe scale.

It is desirable to provide a jet aircraft maneuvering characteristic simulation system for a single propeller aircraft and a single propeller aircraft that make it possible to suppress a left-turning tendency (or a right-turning tendency) that occurs upon a power lever operation of the single propeller aircraft, and to cause an increase in speed upon the power lever operation to be moderate in a manner of an increase in speed of a jet aircraft.

In the following, some example embodiments of the technology are described in detail with reference to the accompanying drawings. Note that the following description is directed to illustrative examples of the disclosure and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the technology are unillustrated in the drawings.

Hereinafter, a jet aircraft maneuvering characteristic simulation system for a single propeller aircraft and a single propeller aircraft according to some example embodiments of the technology are described with reference to the drawings.

It should be noted that, in the following, the jet aircraft maneuvering characteristic simulation system for the single propeller aircraft may sometimes be simply referred to as a "jet aircraft maneuvering characteristic simulation system", and the single propeller aircraft may sometimes be simply referred to as a "propeller aircraft".

It should also be noted that, in the following, the front, the rear, up, and down are described in accordance with the front, the rear, up, and down of the propeller aircraft, and the right and the left are described in accordance with the right and the left with respect to a traveling direction of the propeller aircraft.

Further, described in the following is an example embodiment where the propeller aircraft has a left-turning tendency. It should be noted that the description to be provided below applies similarly to an example embodiment where the propeller aircraft has a right-turning tendency, with the right and the left being reversed.

Figure 1:
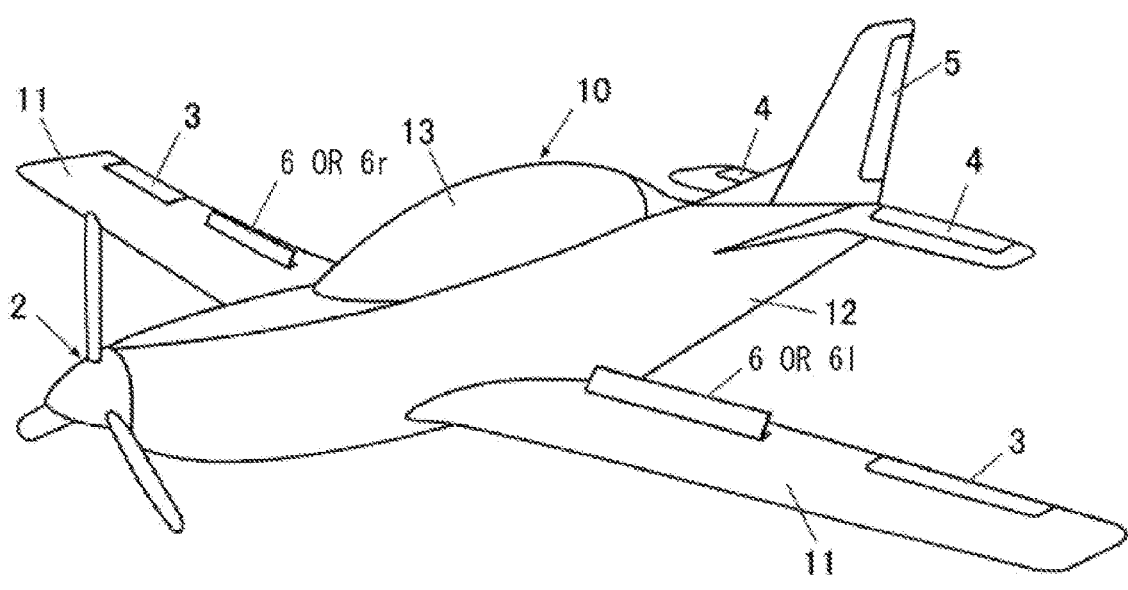
FIG. 1 is a diagram illustrating an example of a configuration of a single propeller aircraft having a jet aircraft maneuvering characteristic simulation system according to one example embodiment of the technology.

FIG. 1 is a diagram illustrating an example of a configuration of the single propeller aircraft according to an example embodiment of the technology.

A propeller aircraft 10 includes speed brakes 6. The speed brakes 6 may be provided on upper surfaces of right and left main wings 11, and may be pivotable upward. The propeller aircraft 10 may also include: a propeller 2 that gives the thrust to an airframe by rotation; an aileron 3; an elevator 4; and a directional rudder 5.

The propeller aircraft 10 may also include a flight control surface other than the aileron 3, the elevator 4, and the directional rudder 5. FIG. 1 illustrates a state in which the speed brakes 6 are deployed upward. In some embodiments, the speed brakes 6 may be provided on lower surfaces of the right and the left main wings 11. In some embodiments, the speed brakes 6 may be provided on both the upper surfaces and the lower surfaces of the right and the left main wings 11.

The speed brakes 6 may be so deployed as to pivot around a base end axis like a flap as with an example embodiment. In an alternative example, the speed brakes 6 may be so deployed that vertically-disposed plate-shaped members are protruded from the upper surfaces, the lower surfaces, or both of the upper and the lower surfaces of the main wings 11. In an example embodiment, the speed brakes 6 may be deployed only by the uniaxial pivot, which helps to simplify a mechanical configuration.

In some embodiments, the speed brakes 6 may be provided on a fuselage 12 of the propeller aircraft 10 at respective right and left parts of the fuselage 12.

Providing the speed brakes 6 at the respective right and left main wings 11 as with an example embodiment helps to generate a force in a yaw direction and a force in a roll direction at the propeller aircraft 10 more easily by the right and the left speed brakes 6 as described below than a case where the speed brakes 6 are provided on the right and the left sides of the fuselage 12.

Figure 2:
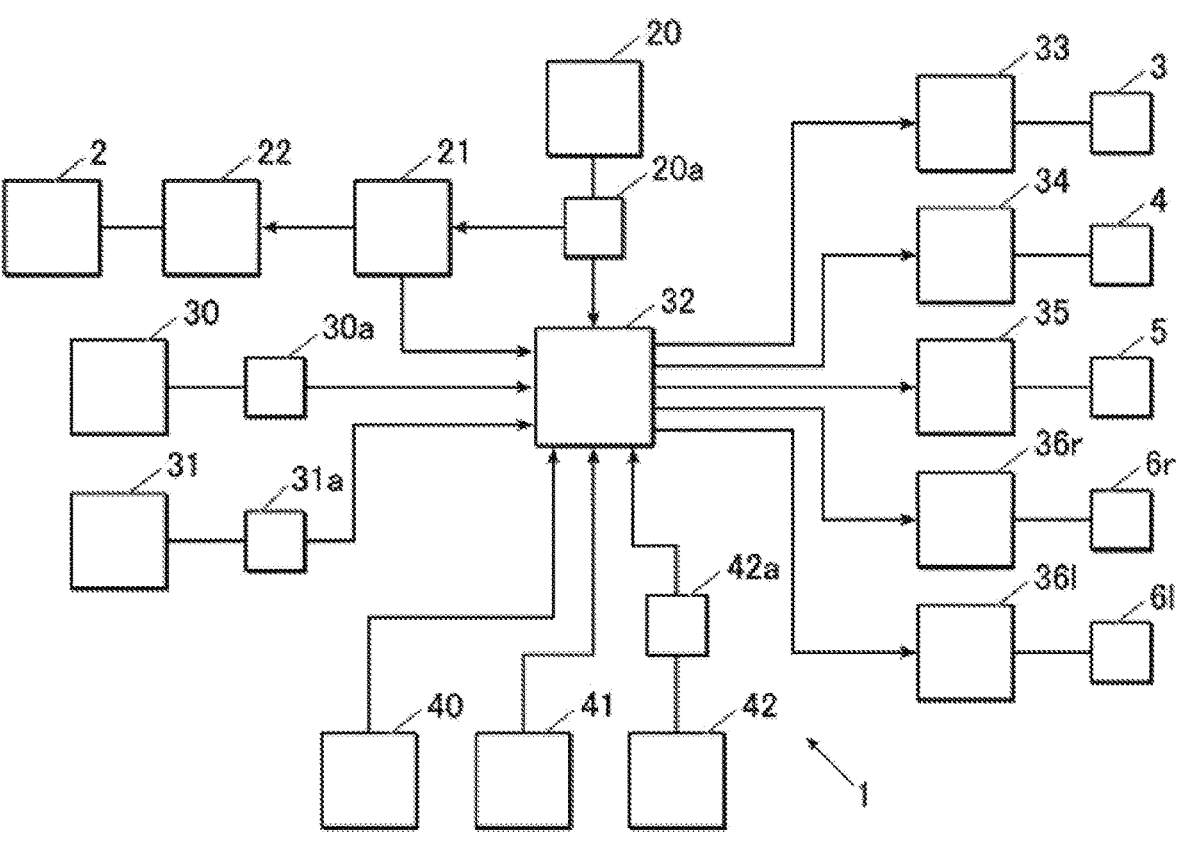
FIG. 2 is a block diagram illustrating a control system of the single propeller aircraft according to one example embodiment.

FIG. 2 is a block diagram illustrating a control system of the propeller aircraft 10.

In general, the airframe may be provided with two or more ailerons 3, two or more elevators 4, and two or more rudder pedals 31; however, FIG. 2 illustrates only one aileron 3, one elevator 4, and one rudder pedal 31 for convenience of description.

The propeller aircraft 10 has a thrust system that includes a power lever 20. The thrust system may also include devices, for example, an electronic controller 21 and an engine 22 that rotationally drives the propeller 2.

The power lever 20 may be provided in a cockpit 13 as illustrated in FIG. 1. The power lever 20 may be provided with a sensor 20a that measures an amount of operation of the power lever 20 performed by a pilot.

The electronic controller 21 may be or may include a device such as an engine PCU (Power Control Unit) or FADEC (Full Authority Digital Engine Control).

The engine 22 of an example embodiment may be a turboprop engine. Alternatively, for example, the engine 22 may be a reciprocating engine.

The sensor 20a may transmit, to the electronic controller 21, data on the amount of operation of the power lever 20 performed by the pilot. The electronic controller 21 may perform any necessary calculation or the like on the basis of the data on the amount of operation of the power lever 20 transmitted from the sensor 20a, and may transmit a calculated throttle command to the engine 22.

The electronic controller 21 may also transmit, to the propeller 2, a pitch command that instructs the pitch.

The engine 22 may adjust a position of a throttle valve on the basis of the throttle command transmitted from the electronic controller 21 to adjust a fuel supply amount. By adjusting the fuel supply amount, the engine 22 may change an output of the engine 22 to adjust, for example, a rotational speed of the propeller 2. The propeller 2 may adjust the pitch on the basis of the pitch command transmitted from the electronic controller 21.

In this way, the propeller aircraft 10 may be adapted to change the thrust of the propeller aircraft 10 by changing the output of the engine 22 and the pitch of the propeller 2 in response to the operation of the power lever 20 performed by the pilot.

The propeller aircraft 10 has a control system including a power supply unit 32. The control system may also include devices, for example, a control column 30, the rudder pedal 31, and actuators 33 to 35 for the respective aileron 3, elevator 4, and directional rudder 5.

The control column 30 and the rudder pedal 31 may be provided in the cockpit 13. The control column 30 may be provided with a sensor 30a that measures an amount of operation of the control column 30 performed by the pilot.

The rudder pedal 31 may be provided with a sensor 31a that measures an amount of pressing of the rudder pedal 31 performed by the pilot.

The power supply unit 32 may be coupled to the sensor 20a of the power lever 20 and the electronic controller 21 described above. The power supply unit 32 may also be coupled to devices including, for example, ADC (Air Data Computer) 40 and an attitude orientation reference device 41.

The sensor 30a may transmit, to the power supply unit 32, data on the amount of operation of the control column 30 in response to the operation of the control column 30. The sensor 31a may transmit, to the power supply unit 32, data on the amount of pressing of the rudder pedal 31 in response to the pressing of the rudder pedal 31.

The power supply unit 32 may receive data on the amount of operation of the power lever 20 from the sensor 20a of the power lever 20 of the thrust system described above. The power supply unit 32 may also receive data on, for example, the pitch and the rotation speed of the propeller 2 from the electronic controller 21 of the thrust system described above. Further, the power supply unit 32 may receive data on, for example, an atmospheric pressure and airspeed from the ADC 40, and may receive data on, for example, an acceleration in a traveling direction, a roll rate, and a yaw rate of the propeller aircraft 10 from the attitude orientation reference device 41. The power supply unit 32 may perform, for example, any necessary calculation on the basis of the received pieces of data. The power supply unit 32 may supply, from an unillustrated device such as a storage battery, necessary electric power to each of the actuators 33, 34, and 35 of the respective aileron 3, elevator 4, and directional rudder 5 to adjust an amount of operation of each of the actuators 33 to 35.

In this way, the propeller aircraft 10 may be adapted to change an attitude of the airframe, or change a traveling direction of the airframe (e.g., raise, lower, or turn the airframe), by tilting the aileron 3, the elevator 4, and the directional rudder 5 on an as-necessary basis in response to the operation of the control column 30 and the rudder pedal 31 performed by the pilot.

In one example, the propeller aircraft 10 may have a control unit that is used for the directional rudder 5 and provided separately from the power supply unit 32, for the operation of the directional rudder 5 in response to the pressing of the rudder pedal 31.

The propeller aircraft 10 according to an example embodiment may include a speed brake lever 42 provided in the cockpit 13.

The speed brake lever 42 may be provided with a sensor 42a that measures an amount of operation of the speed brake lever 42 performed by the pilot. The sensor 42a may be coupled to the power supply unit 32.

The sensor 42a may transmit, to the power supply unit 32, data on the amount of operation of the speed brake lever 42 in response to the operation of the speed brake lever 42. The power supply unit 32 may perform, for example, any necessary calculation on the basis of the received data on the amount of operation of the speed brake lever 42. The power supply unit 32 may supply, from an unillustrated device such as the storage battery, necessary electric power to each of actuators 36r and 36l of the respective speed brakes 6r and 6l positioned on the right and the left sides of the airframe to adjust an amount of operation of each of the actuators 36r and 36l.

Thus, the actuators 36r and 36l may be operated to deploy the speed brakes 6r and 6l upward.

In this way, in an example embodiment, the pilot may operate the speed brake lever 42 to change an amount of deployment of the speed brakes 6r and 6l and thereby to change an air resistance to be applied to the airframe.

In the propeller aircraft 10, the pilot may change the air resistance to be applied to the airframe of the propeller aircraft 10, making it possible to adjust a speed reduction rate and a descent rate of the propeller aircraft 10.

In an example embodiment described above, the right and the left speed brakes 6r and 6l of the airframe may be respectively provided with the actuators 36r and 36l, allowing the right and the left speed brakes 6r and 6l to operate independently.

In a case where the pilot operates the speed brake lever 42 to activate the speed brakes 6r and 6l as described above, the amounts of deployment of the respective right and the left speed brakes 6r and 6l may change together by the same amount as each other.

A description is given next of a jet aircraft maneuvering characteristic simulation system 1 for the single propeller aircraft 10 according to an example embodiment.

The propeller aircraft 10 has the jet aircraft maneuvering characteristic simulation system 1.

The jet aircraft maneuvering characteristic simulation system 1 includes a controller that controls the speed brakes 6r and 6l as described below. In one embodiment, the power supply unit 32 of the propeller aircraft 10 described above may serve as a "controller".

Hereinafter, described is an example embodiment in which the power supply unit 32 serves as the controller (i.e., a controller 32).

The controller 32 in an example embodiment deploys both the right and the left speed brakes 6r and 6l of the airframe to cause the increase in the speed Vp to be moderate, in response to the operation of the power lever 20 performed by the pilot to raise the thrust of the propeller aircraft 10.

Further, in addition to causing the increase in the speed Vp to be moderate, the controller 32 controls the speed brakes 6r and 6l to cause the force in the yaw direction and the force in the roll direction to be generated that act against the turning tendency of the propeller aircraft 10 by making the amount of deployment of the right speed brake 6r and the amount of deployment of the left speed brake 6l different from each other.

In the following, a description is given specifically of processes to be executed by the controller 32 of the jet aircraft maneuvering characteristic simulation system 1 according to an example embodiment.

In addition, a description is given also of workings of the jet aircraft maneuvering characteristic simulation system 1 according to an example embodiment.

Figure 3:
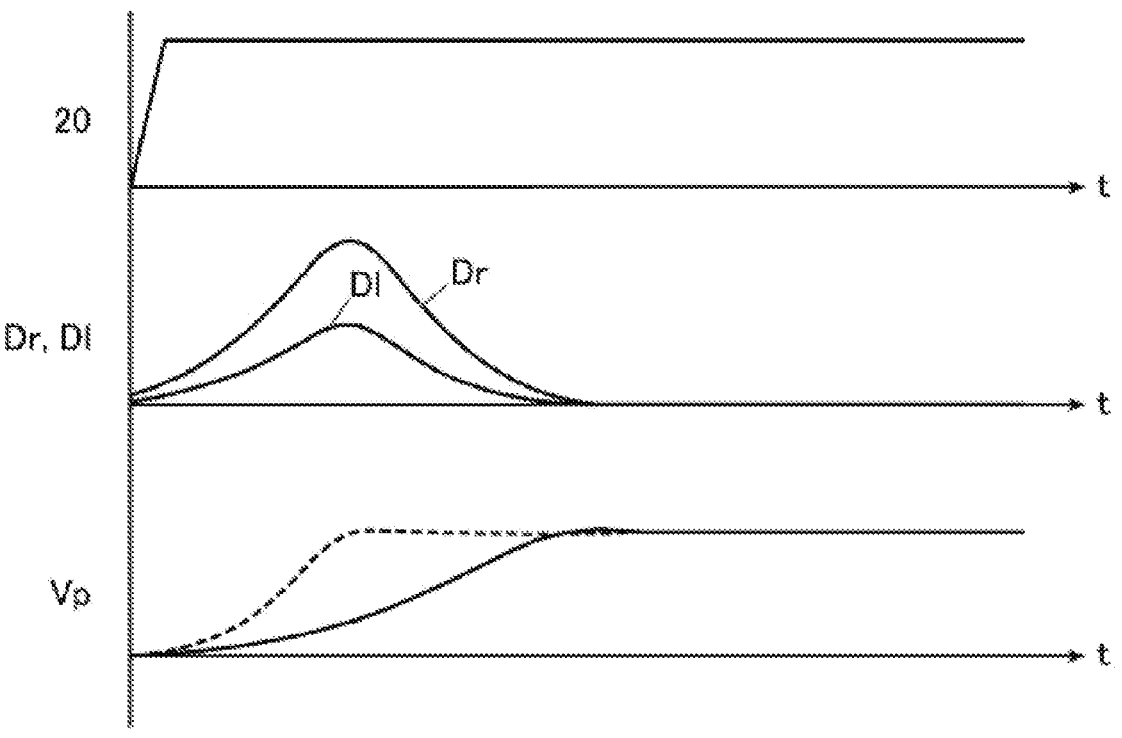
FIG. 3 is a diagram illustrating a relationship between an operation of a power lever, a deployment of speed brakes, and a change in speed of the single propeller aircraft according to one example embodiment.

Referring to FIG. 3, the pilot may so operate the power lever 20 as to raise the thrust of the propeller aircraft 10 upon, for example, takeoff of the propeller aircraft 10.

In response to the operation of the power lever 20, the pieces of data based on the operation of the power lever 20 may be transmitted to the controller 32, e.g., the power supply unit 32, from the sensor 20a of the power lever 20 and from the electronic controller 21 as described above.

The controller 32 may cause the necessary electric power to be supplied to each of the actuators 36r and 36l of the right and the left speed brakes 6r and 6l to deploy each of the right and the left speed brakes 6r and 6l upward, in response to the operation of the power lever 20 as described above.

For example, in a case where the power lever 20 is so operated as to raise the thrust of the propeller aircraft 10, the controller 32 may increase each of a deployment amount Dr of the speed brake 6r on the right side of the airframe and a deployment amount Dl of the speed brake 6l on the left side of the airframe as illustrated in FIG. 3.

As a result, the air resistance to be applied to the airframe of the propeller aircraft 10 increases in accordance with the deployment amounts Dr and Dl of the speed brakes 6r and 6l.

Accordingly, the speed Vp of the propeller aircraft 10 becomes smaller as denoted by a solid line of the speed Vp illustrated in FIG. 3 than that of a case where no deployments of the speed brakes 6r and 6l are performed as denoted by a broken line of the speed Vp illustrated in FIG. 3.

Thereafter, the controller 32 may decrease each of the deployment amounts Dr and Dl of the once-deployed speed brakes 6r and 6l and close the right and the left speed brakes 6r and 6l.

Thus, by decreasing the deployment amounts Dr and Dl of the right and the left speed brakes 6r and 6l, the air resistance to be applied to the airframe of the propeller aircraft 10 is reduced and the speed Vp of the propeller aircraft 10 is increased, as denoted by the solid line of the speed Vp illustrated in FIG. 3.

Accordingly, in a case where the power lever 20 is operated to raise the thrust of the propeller aircraft 10, the controller 32 may once deploy the speed brakes 6r and 6l and thereafter close the speed brakes 6r and 6l. This helps to cause the increase in the speed Vp of the propeller aircraft 10 to be moderate.

For example, this helps to make the increase in the speed Vp of the propeller aircraft 10 slower as denoted by the solid line of the speed Vp illustrated in FIG. 3 than a case where no deployments of the speed brakes 6r and 6l are performed as denoted by the broken line of the speed Vp illustrated in FIG. 3.

In an example embodiment, controlling the speed brakes 6r and 6l as described above helps to delay the increase in the speed Vp of the propeller aircraft 10 upon the power lever operation, e.g., upon the operation of the power lever 20 to raise the thrust of the propeller aircraft 10. This helps to cause the increase in the speed Vp upon the power lever operation of the propeller aircraft 10 to be moderate in a manner of the increase in the speed Vj of the jet aircraft as illustrated in FIG. 5.

An example embodiment thus allows the propeller aircraft 10 to simulate the slow increase characteristic of the speed Vj of the jet aircraft upon the power lever operation.

In addition, the controller 32 in an example embodiment makes the deployment amounts Dr and Dl of the right and the left speed brakes 6r and 6l different from each other as illustrated in FIG. 3 upon deploying the right and the left speed brakes 6r and 6l at the time of the power lever operation as described above.

It should be noted that the single propeller aircraft 10 has the left-turning tendency (or the right-turning tendency) as a maneuvering characteristic upon the power lever operation. Described in the following is an example embodiment where the propeller aircraft 10 has the left-turning tendency as mentioned previously.

The left-turning tendency of the single propeller aircraft 10 is generated as a result of the force in the yaw direction and the force in the roll direction that act on the airframe due to the combined effect of factors including, for example, the propeller slipstream, the P-factor, the gyro effect, and the torque reaction described above.

Figure 4:
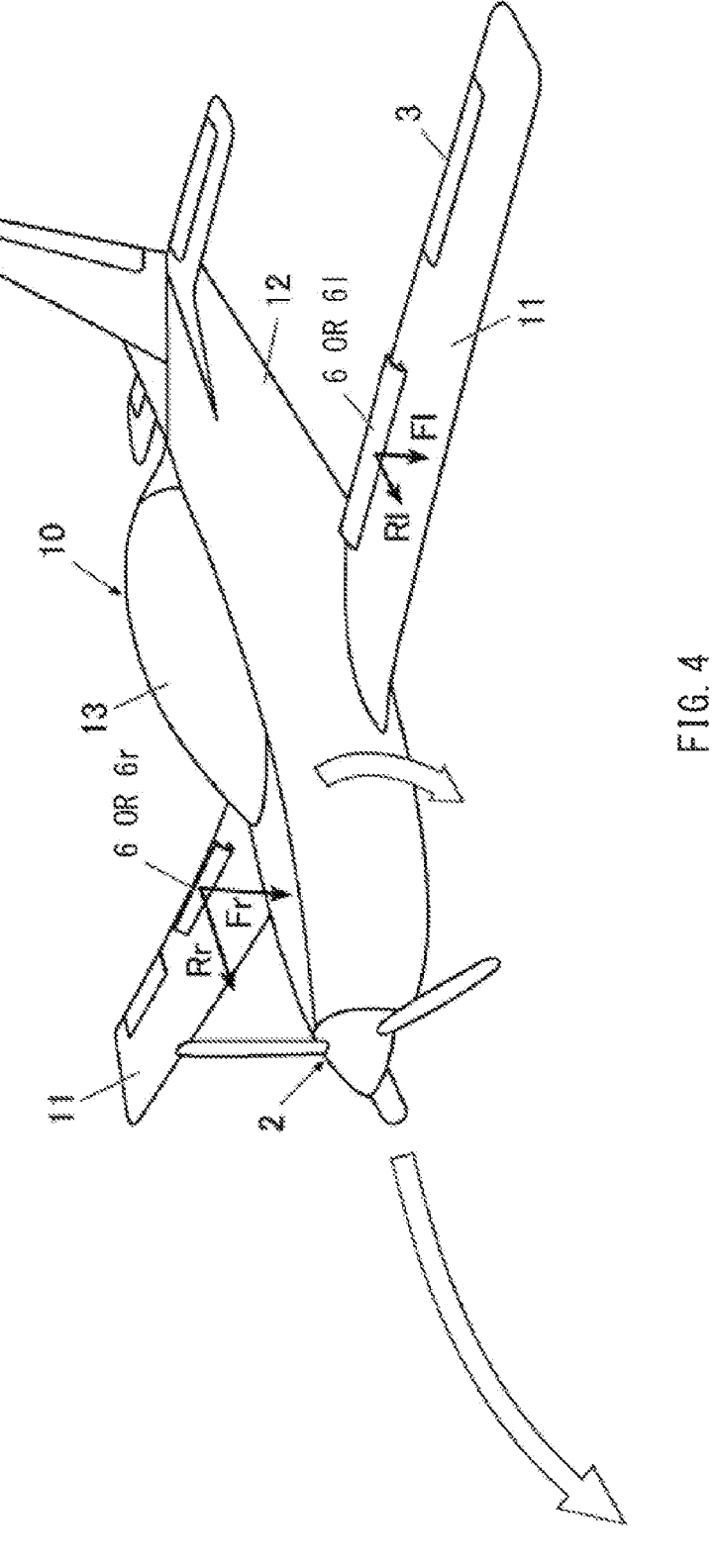
FIG. 4 is a diagram illustrating a force in a yaw direction and a force in a roll direction that act on an airframe, and illustrating an air resistance and a pushing-down force generated by the right and the left speed brakes.

In this case, referring to FIG. 4, the force in the yaw direction acts in a direction in which the airframe turns left, and the force in the roll direction acts in a direction in which the left side of the airframe is pushed down, as denoted by the white arrows in FIG. 4.

In an example embodiment where the propeller aircraft 10 has the left-turning tendency, the controller 32 may so control the speed brakes 6r and 6l as to make the upward deployment amount Dr of the right speed brake 6r greater than the deployment amount Dl of the left speed brake 6l.

With this configuration, an air resistance Rr to be generated by the right speed brake 6r becomes greater than an air resistance Rl to be generated by the left speed brake 6l.

This helps to generate the force in the yaw direction that acts against the left-turning tendency of the propeller aircraft 10. For example, this helps to generate a force that causes the propeller aircraft 10 to make the right turn.

Further, with the above configuration, a pushing-down force Fr that is to be generated by the right speed brake 6r and pushes down the airframe (e.g., the main wing 11) becomes greater than a pushing-down force Fl that is to be generated by the left speed brake 6l and pushes down the airframe.

Accordingly, this helps to generate the force in the roll direction that acts against the left-turning tendency of the propeller aircraft 10. For example, this helps to generate a force that pushes down the right side of the airframe.

In this way, making the deployment amounts Dr and Dl of the right and the left speed brakes 6r and 6l different from each other upon the power lever operation helps to generate the force in the yaw direction and the force in the roll direction that act against the left-turning tendency of the propeller aircraft 10.

It should be appreciated that the controller 32 may so control the speed brakes 6r and 6l as to make the deployment amount Dl of the left speed brake 6l greater than the deployment amount Dr of the right speed brake 6r, in an example embodiment where the propeller aircraft 10 has the right-turning tendency.

In an example embodiment, the speed brakes 6r and 6l are controlled as described above to generate the force in the yaw direction and the force in the roll direction that act against the turning tendency of the propeller aircraft 10, which helps to suppress the turning tendency that occurs upon the power lever operation of the propeller aircraft 10.

In this way, an example embodiment allows the propeller aircraft 10 to simulate the maneuvering characteristic of the jet aircraft that does not involve the turning tendency upon the power lever operation.

The jet aircraft maneuvering characteristic simulation system 1 for the single propeller aircraft and the single propeller aircraft 10 according to some example embodiments of the technology described above control the right and the left speed brakes 6r and 6l by the controller 32 upon the power lever operation.

Thus, the jet aircraft maneuvering characteristic simulation system 1 for the single propeller aircraft and the single propeller aircraft 10 according to some example embodiments of the technology allow the single propeller aircraft 10 to simulate the slow increase characteristic of the speed Vj of the jet aircraft upon the power lever operation and the maneuvering characteristic of the jet aircraft that does not involve the turning tendency upon the power lever operation.

Hence, it becomes difficult for the single propeller aircraft 10 described above to cause the turning tendency upon the power lever operation and thereby makes it unnecessary for the pilot or a trainee to learn an unnecessary technique such as stepping on a right rudder.

In addition, the single propeller aircraft 10 described above allows the speed Vp to increase slowly upon the power lever operation as with a case of the jet aircraft, making it possible for the pilot or the trainee to practice maneuvering of the jet aircraft without feeling a sense of strangeness when a training is transferred to the jet aircraft.

It should be noted that an example embodiment has been described above in which the power supply unit 32 may serve as the controller.

This configuration helps to allow the power supply unit 32 to perform the regular processes described above, including the supply of electric power to each of the actuators in response to an operation of a device such as the control column 30, and the process unique to an example embodiment of the technology described above, with the consistency of both of such processes being maintained.

In some embodiments, the controller may a device provided separately from the power supply unit 32.

In some embodiments, in a case where the power supply unit 32 (the controller 32 in one embodiment) performs, for example, the control on the right and the left speed brakes 6r and 6l to suppress the turning tendency of the propeller aircraft 10 as described above, one or more of devices including the aileron 3, the elevator 4, and the directional rudder 5 may be activated as well in conjunction with, for example, the control on the right and the left speed brakes 6r and 6l.

In some embodiments, in a case where the propeller aircraft 10 is not provided with a device such as the FADEC described above, a signal on a factor, such as the rotational speed of the propeller 2, sent from a device such as the engine 22 to an unillustrated instrument panel may be transmitted to the controller 32 as well.

Although some example embodiments of the technology have been described in the foregoing by way of example with reference to the accompanying drawings, the technology is by no means limited to the embodiments described above. It should be appreciated that modifications and alterations may be made by persons skilled in the art without departing from the scope as defined by the appended claims. The technology is intended to include such modifications and alterations in so far as they fall within the scope of the appended claims or the equivalents thereof.

For example, in an example embodiment described above, the single propeller aircraft 10 may be the training aircraft. In some embodiments, the single propeller aircraft 10 does not necessarily have to be the training aircraft and may be any other aircraft.

According to at least one embodiment of the technology, it is possible to suppress the left-turning tendency (or the right-turning tendency) that occurs upon the power lever operation of the single propeller aircraft, and to cause the increase in speed upon the power lever operation to be delayed in a manner of the slow increase in speed of the jet aircraft.

The invention claimed is:

1. An aircraft maneuvering system for a single propeller aircraft, the aircraft maneuvering system comprising:

a power lever configured to change a thrust of the single propeller aircraft;

speed brakes comprising a right speed brake and a left speed brake provided on respective right and left sides of the single propeller aircraft; and a controller configured to, in response to an operation of the power lever to raise the thrust of the single propeller aircraft, deploy both the right speed brake and the left speed brake to delay an increase in speed of the single propeller aircraft upon the operation of the power lever; and control the speed brakes to generate a yaw force and a roll force that oppose a turning tendency of the single propeller aircraft, by making an amount of deployment of the right speed brake and an amount of deployment of the left speed brake different from each other.

2. The aircraft maneuvering system for the single propeller aircraft according to claim 1, wherein the controller is configured to control the speed brakes to make an amount of the deployment of the right speed brake greater than an amount of the deployment of the left speed brake in a case where the single propeller aircraft has a left-turning tendency, and control the speed brakes to make the amount of the deployment of the left speed brake greater than the amount of the deployment of the right speed brake in a case where the single propeller aircraft has a right-turning tendency.

3. The aircraft maneuvering system for the single propeller aircraft according to claim 2, wherein the speed brakes are provided on respective right and left main wings of the single propeller aircraft.

4. The aircraft maneuvering system for the single propeller aircraft according to claim 3, wherein the single propeller aircraft comprises a power supply unit configured to serve as the controller.

5. A single propeller aircraft, comprising the aircraft maneuvering system for the single propeller aircraft according to claim 4.

6. A single propeller aircraft, comprising the aircraft maneuvering system for the single propeller aircraft according to claim 3.

7. The aircraft maneuvering system for the single propeller aircraft according to claim 2, wherein the single propeller aircraft comprises a power supply unit configured to serve as the controller.

8. A single propeller aircraft, comprising the aircraft maneuvering system for the single propeller aircraft according to claim 7.

9. A single propeller aircraft, comprising the aircraft maneuvering system for the single propeller aircraft according to claim 2.

10. The aircraft maneuvering system for the single propeller aircraft according to claim 1, wherein the speed brakes are provided on respective right and left main wings of the single propeller aircraft.

11. The aircraft maneuvering system for the single propeller aircraft according to claim 10, wherein the single propeller aircraft comprises a power supply unit configured to serve as the controller.

12. A single propeller aircraft, comprising the aircraft maneuvering system for the single propeller aircraft according to claim 11.

13. A single propeller aircraft, comprising the aircraft maneuvering system for the single propeller aircraft according to claim 10.

14. The aircraft maneuvering system for the single propeller aircraft according to claim 10, wherein respective trailing edges of the right and left main wings have right and left ailerons, and the controller is configured to deploy the right and left speed brakes and thereafter close the right and left speed brakes.

15. The aircraft maneuvering system for the single propeller aircraft according to claim 1, wherein the single propeller aircraft comprises a power supply unit configured to serve as the controller.

16. A single propeller aircraft, comprising the aircraft maneuvering system for the single propeller aircraft according to claim 15.

17. A single propeller aircraft, comprising the aircraft maneuvering system for the single propeller aircraft according to claim 1.

\* \* \* \* \*